United States Patent [19]

Wu

[11] Patent Number: 6,127,698

[45] Date of Patent: *Oct. 3, 2000

[54] HIGH DENSITY/SPEED NONVOLATILE MEMORIES WITH A TEXTURED TUNNEL OXIDE AND A HIGH CAPACITIVE-COUPLING RATIO

[75] Inventor: Shye-Lin Wu, Hsinchu, Taiwan

[73] Assignee: Texas Instruments - Acer Incorporated, Hsinchu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 09/046,343

[22] Filed: Mar. 23, 1998

[51] Int. Cl.[7] .......................... H01L 29/30; H01L 29/788; H01L 29/06

[52] U.S. Cl. .............................................. 257/321; 257/30

[58] Field of Search .................................... 257/321, 316, 257/315, 314, 324, 325, 30, 37

[56] References Cited

U.S. PATENT DOCUMENTS

| | | | |
|---|---|---|---|
| 4,935,804 | 6/1990 | Ito et al. | 357/71 |
| 5,011,787 | 4/1991 | Jeuch | 437/52 |
| 5,427,970 | 6/1995 | Hsue et al. | 437/43 |
| 5,429,966 | 7/1995 | Wu | 437/43 |
| 5,473,179 | 12/1995 | Hong | 257/321 |
| 5,585,656 | 12/1996 | Hsue et al. | 257/321 |
| 5,683,923 | 11/1997 | Shimizu et al. | 437/43 |
| 5,796,140 | 8/1998 | Tomioka | 257/316 |
| 5,814,856 | 9/1998 | Bergemont et al. | 257/319 |
| 5,970,342 | 10/1999 | Wu | 438/260 |

OTHER PUBLICATIONS

Albert Bergemont et al., Low Voltage NVG™: A New High Performance 3 V/5 V Flash Technology for Portable Computing and Telecommunications Applications, IEEE Transactions on Electronics Devices, vol. 43, No. Sep. 1996, pp. 1510–1517.

H. Shirai et al., A 0.54μm² Self–Aligned, HSG Floating Gate Cell (SAHF Cell) for 256Mbit Flash Memories, 1995 IEEE, pp. 653–656.

Yosiaki S. Hisamune et al., A High Capacitive–Coupling Ratio (HiCR) Cell for 3 V–Only 64 Mbit and Future Flash Memories, 1993 IEEE, pp. 19–22.

Christopher J. Hegarty et al., Enhanced Conductivity and Breakdown of Oxides Grown on Heavily Implanted Substrates, Solid State Electronics, vol. 34, No. 11, 1991; pp. 1207–1213.

Shye Lin Wu et al., Characterization of Thin Textured Tunnel Oxide Prepared by Thermal Oxidation of Thin Polysilicon Film on Silicon, IEEE Transactions on Electron Devices, vo. 43, No. 2, Feb. 1996, pp. 287–294.

Hisamune et al. A High Capacitive–Coupling Ratio (HiCR) Cell for 3 V–only 64 Mbit and Future Flash Memories. 1993 IEEE pp. 19–22.

H. Shirai et al., A 0.54 m2 Self–Aligned, HSG Floating Gate Cell (SAHF Cell) for 256 Mbit Flash Memories, 1993 IEEE, pp. 19–22.

Christopher J. Hegarty et al., Enhanced Conductivity and Breakdown of Oxides Grown on Heavily Implanted Substrates, Solid State Electronics, vol. 34, No. 11, 1991, pp. 1207–1213.

*Primary Examiner*—David Hardy
*Assistant Examiner*—Bradley William Baumeister
*Attorney, Agent, or Firm*—Harness, Dickey & Pierce, P.L.C.

[57] ABSTRACT

The present invention proposes a structure of nonvolatile memory cell with a textured tunnel oxide and a high capacitive-coupling ratio. A non-tunnel oxide is formed on the semiconductor substrate. The tunnel oxides with textured surfaces are formed on the semiconductor substrate and are separated by the non-tunnel oxide. The source and drain are formed aligned to the tunnel oxides in the semiconductor substrate. The floating gate, the interpoly dielectric and the control gate, are formed in turn over the tunnel and non-tunnel oxides. Due to the textured structure of the tunnel oxide, the high-density and high-speed nonvolatile memory can be achieved.

14 Claims, 3 Drawing Sheets

HIGH DENSITY/SPEED NONVOLATILE MEMORIES WITH A TEXTURED TUNNEL OXIDE AND A HIGH CAPACITIVE-COUPLING RATIO

BACKGROUND OF THE INVENTION

1. Field of the Invention

The present invention relates to a nonvolatile memory, and more especially, to a high density/speed nonvolatile memory with a rugged tunnel oxide and a high capacitive-coupling ratio.

2. Description of the Prior Art

Nonvolatile memories, including mask read-only memories (Mask ROM), programmable ROM (PROM), erasable programmable ROM (EPROM), electrically erasable programmable ROM (EEPROM or E$^2$PROM) and flash memories, retain their memory data whenever the power is turned off, and have wide applications in the computer and electronic industry. In recent years, the markets of the portable computer and telecommunication markets have developed rapidly have and become a major driving force in the design and technology of the semiconductor integrated circuit. As stated by A. Bergemont, et al., in "Low Voltage NVG™: A New High Performance 3 V/5 V Flash Technology for Portable Computing and Telecommunications Application"(IEEE Trans. Electron Devices Vol. 43, p. 1510 (1996)), demand has created a great need for low power, high density, and electrically re-writable nonvolatile memories. That is, the memories programmable and erasable as EPROM, E$^2$PROM or flash memories are required for the aforementioned systems to store operating systems or application software.

The basic storage cell of these programmable and erasable memories contain a double polysilicon storage transistor with a floating gate isolated in silicon dioxide and capacitively coupled to a second control gate which is stacked above it. The E$^2$PROM cell further comprises an access, or select, transistor. These memories execute the programming and erasure by charging or discharging their floating gates. For example, the EPROM is programmed by hot electron injection at the drain to selectively charge the floating gate and are erased by discharging the floating gate with ultraviolet light or X-ray. The latter has never been commercially applied for this purpose. The E$^2$PROM and most of the flash memories are programmed by hot electron injection or cold electron tunneling named Flower-Nordheim tunneling, and erased mostly by Flower-Nordheim tunneling from the floating gate to the source, with the control gate ground.

Flower-Nordheim tunneling, or cold electron tunneling, is a quantum-mechanical effect, which allows the electrons to pass through the energy barrier at the silicon-silicon dioxide interface at a lower energy than required to pass over it. H. Shirai, et al., stated in their paper "A 0.54 $\mu$m$^2$ Self-Aligned, HSG Floating Gate Cell (SAHF Cell) for 256 Mbit Flash Memories"(IEDM Tech. Dig. Vol. 95, p. 653 (1995)) that, because of its low current consumption, the Flower-Nordheim program/erase scheme becomes indispensable for low power operation of the E$^2$PROM and flash memories. However, the Flower-Nordheim program/erase scheme requires high voltage applied to the control gate of the memory cell due to its need for a large reversible electric field to the thin oxide separating the floating gate from the substrate. Therefore, to lower the control gate bias, the memory cell must have a high capacitive-coupling ratio structure.

Y. S. Hisamune, et al., propose a method for fabricating a flash memory cell with contactless array and high capacitive-coupling ratio in "A High Capacitive-Coupling Ratio (HiCR) Cell for 3 V-Only 64 Mbit and Future Flash Memories", (IEDM Tech. Dig. Vol. 93, p. 19 (1993)). However, this method achieves high capacitive-coupling ratio with four times the polysilicon deposition and has a complex fabrication. Furthermore, as mentioned by C. J. Hegarty, et al., in "Enhanced Conductivity and Breakdown of Oxides Grown on Heavily Implanted Substrates (Solid-State Electronics, Vol. 34, p. 1207 (1991)), it is also difficult to fabricate a thin tunnel oxide on the heavily doped substrate with a high electron injection efficiency and a large charge-to-breakdown for low power nonvolatile memories. Thus, to reach high capacitive-coupling ratio, high electron injection efficiency and a large charge-to-breakdown with a simple manufacture is the subject of high density and low power nonvolatile memories today.

SUMMARY OF THE INVENTION

A method for fabricating a nonvolatile memory cell with rugged tunnel oxide is disclosed. First, the field oxide is formed, the active region is defined, and a semiconductor substrate is prepared. A stacked silicon oxide/silicon nitride layer is deposited on the substrate and then the tunnel oxide region is defined by a standard photolithography process followed by an anisotropic etching. A high temperature steam oxidation process is used to grow a thick thermal oxide on the non-tunnel region. After removing the masking silicon nitride layer, the n+ impurity ions are implanted to form the source and drain, and a thermal annealing is performed to recover the implantation damage and to drive in the doped ions. Next, the pad oxide film is etched back and an ultra-thin undoped $\alpha$-Si, or HSG-Si, film is deposited. A thermal oxidation process is carried out to convert the undoped $\alpha$-Si or HSG-Si into rugged tunnel oxide. Finally, the first n+ doped polysilicon film which serves as the floating gate, the interpoly dielectric such as ONO and, the second n+ doped polysilicon film which serves as the control gate are sequentially formed, and the memory cell is finished.

The nonvolatile memory cell built here is constructed by a semiconductor substrate with a non-tunnel oxide, tunnel oxides, the source, the drain and the gate structure. The non-tunnel oxide is formed on the semiconductor substrate. The tunnel oxides with rugged surfaces are formed on the semiconductor substrate and are separated by the non-tunnel oxide from each other. The doped ion regions that serve as the source and drain are formed aligned to the tunnel oxides in the semiconductor substrate. The stacked gate structure, which consists in turn of a floating gate, an interpoly dielectric and a control gate, is formed over the tunnel and non-tunnel oxides. Due to the textured structure of the tunnel oxide, the high-density and high-speed nonvolatile memory can be achieved.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a simple method to fabricate a nonvolatile memory cell with a high capacitive-coupling ratio. The method described here includes many process steps well known in the art like photolithography, etching, or chemical vapor deposition (CVD) which are not discussed in detail. In addition, the present invention utilizes a method for forming a rugged tunnel oxide to attain high electron injection efficiency and a large charge-to-breakdown for low power nonvolatile memories.

Figure 1:
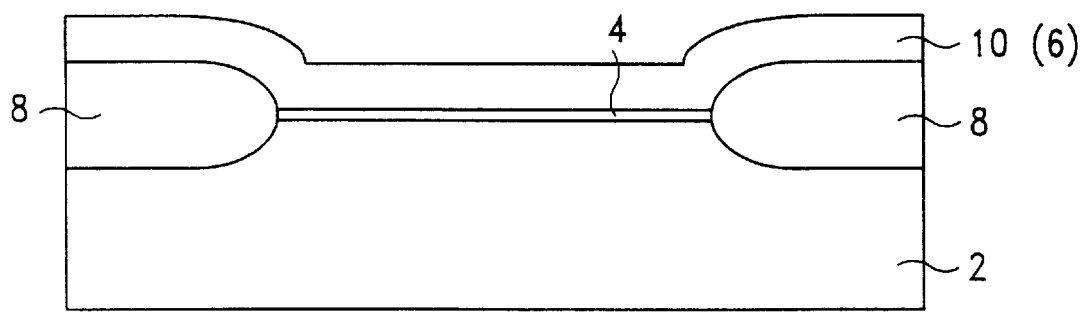
FIG. 1 is a cross-sectional view of a semiconductor wafer illustrating the step of forming a silicon oxide layer and a silicon nitride layer on the substrate according to the present invention.

Referring to FIG. 1, a single crystal silicon substrate 2 with a <100> crystallographic orientation is provided. A silicon oxide layer 4 is formed on the surface of the substrate 2. In addition to a pad oxide for the oxidation mask, the silicon oxide layer 4 can be used to act as a sacrificial oxide to prevent the channel effect during the later ion implantation. This pad oxide layer 4 has a thickness of about 40–300 angstroms, and can be grown using thermal oxidation at a temperature of about 800–1100° C., or using low pressure chemical vapor deposition (LPCVD) at a temperature of about 400–750° C. Next, a thick silicon nitride layer 6 is deposited, for example, using a LPCVD process at a temperature of about 700–800° C. on the pad oxide layer 4 to serve as an oxidation mask.

The field oxide (FOX) pattern is now defined using a conventional manner of photolithography including photoresist coating, exposure, and development processes, and then a dry etching is carried out to etch the thick silicon nitride layer 6 and the pad oxide layer 4. After photoresist is removed and wet cleaned, a thermal oxidation in an oxygen steam environment is performed, and the thick field oxide regions 8 are grown with a thickness of about 3000–8000 angstroms, to provide isolation between active regions on the substrate 2. Then, the silicon nitride layer 6 is optionally removed, and a new silicon nitride layer 10 are created over the substrate 2.

Figure 2:
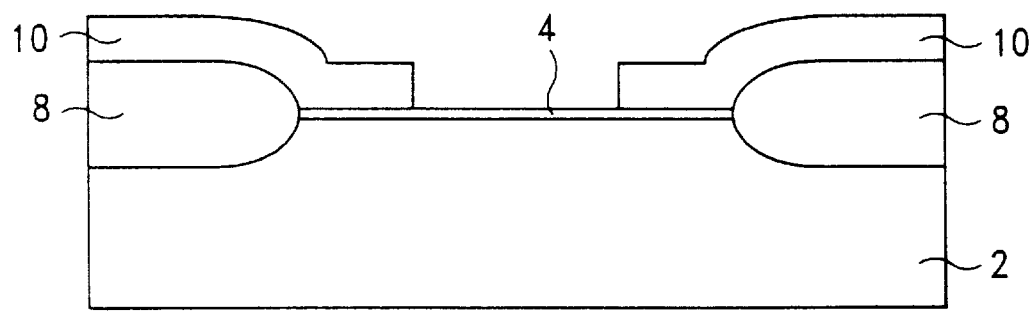
FIG. 2 is a cross-sectional view of a semiconductor wafer illustrating the step of defining the tunnel oxide regions on the substrate according to the present invention.
Figure 3:
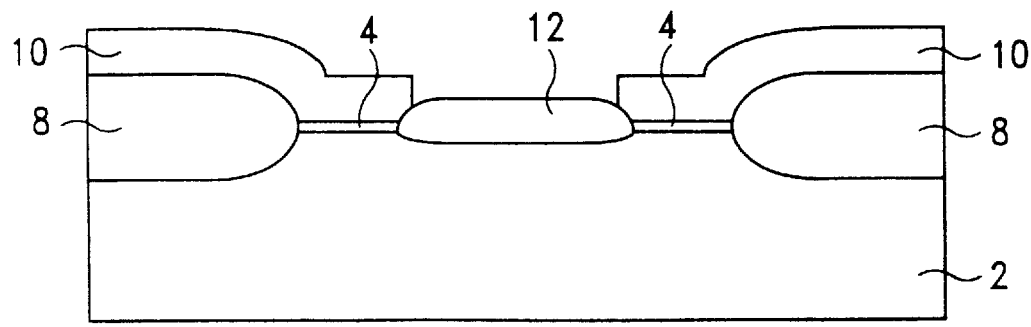
FIG. 3 is a cross-sectional view of a semiconductor wafer illustrating the step of growing a thick thermal oxide on the substrate according to the present invention.

Turning next to FIG. 2, another photolithography process is used to define the tunnel oxide region. An etching step follows to selectively etch the silicon nitride layer 10 but not the pad oxide layer 4 and to expose a portion of the pad oxide layer 4 which defines the non-tunnel region on the active region. This selectivity can be reached by a dry etching process using $CF_4/O_2$, $CF_2/H_2$, $CHF_3$ or $NF_3$ as the plasma source. A high temperature steam oxidation is then performed at a temperature of about 800–1100° C. to grow a thick thermal oxide 12 on the non-tunnel region, as shown in FIG. 3. This thermal oxide 12 has a thickness of about 300–2500 angstroms, and a bottom surface with recessed topography and can raise the capacitive-coupling ratio of the memory cell.

Figure 4:
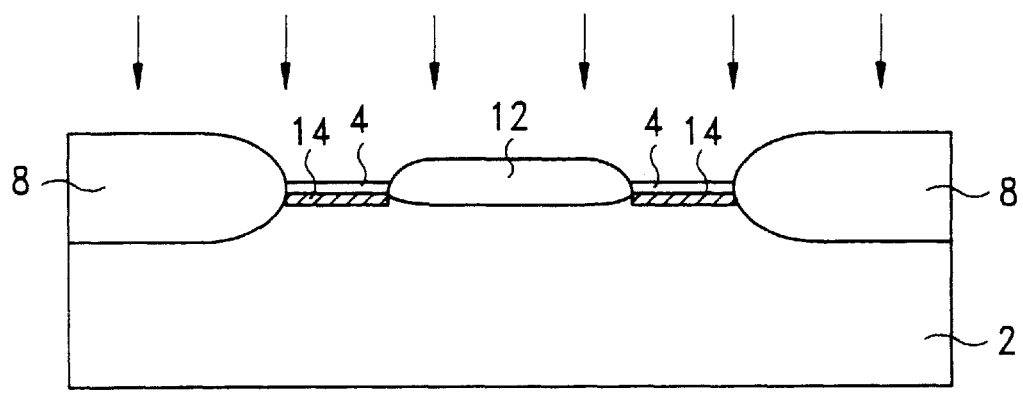
FIG. 4 is a cross-sectional view of a semiconductor wafer illustrating the step of forming the source and drain regions on the substrate according to the present invention.
Figure 5:
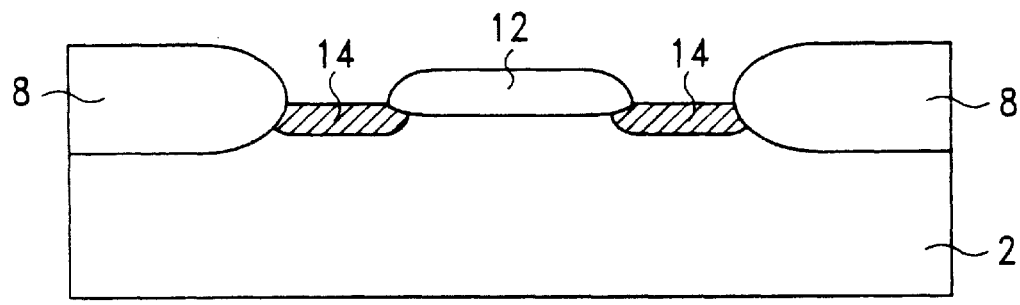
FIG. 5 is a cross-sectional view of a semiconductor wafer illustrating the step of performing a high temperature annealing and removing the pad oxide film according to the present invention.

Turning next to FIG. 4, the masking silicon nitride film 10 is removed by a wet etching with hot phosphoric acid. An n+ ion implantation is performed to implant appropriate impurity ions through the silicon oxide layer 4, but not the thick oxide 12, into the substrate 2 to form the source and drain 14. The implanted ions can be phosphorus ions, arsenic ions or antimony ions. The implantation energy and dosage are respectively about 0.5–150 keV and about $5 \times 10^{14}$–$5 \times 10^{16}$ atoms/cm². During the ion implantation, the silicon oxide layer 4 acts as a buffer to prevent the substrate 2 from being damaged and to prevent the doped ions from suffering channel effect. The substrate 2 is then thermal annealed to recover the implantation damage by a preferable method as rapid thermal processing (RTP) at a temperature of about 800–1150° C. The dopants are activated and are driven in to form the best distribution profile at this step, as shown in FIG. 5. The silicon oxide 4 is now removed, with a suitable etchant such as buffered oxide-etching (BOE) solution or diluted solution of hydrofluoric acid (HF).

Figure 6:
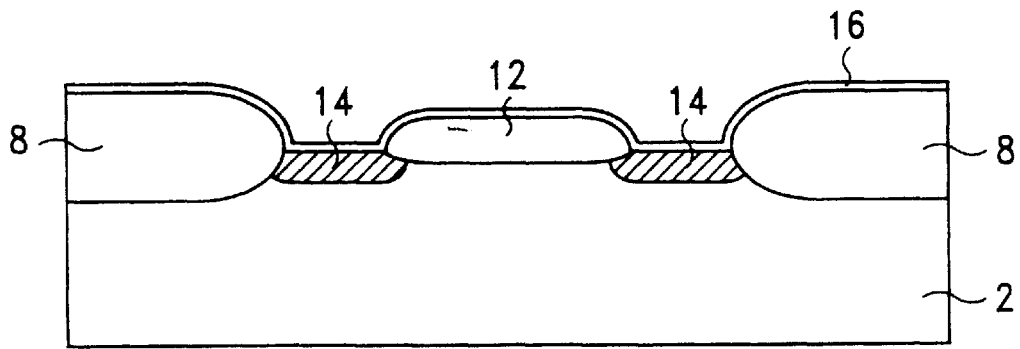
FIG. 6 is a cross-sectional view of a semiconductor wafer illustrating the step of depositing an ultra-thin undoped α-Si or HSG-Si film on the substrate according to the present invention.
Figure 7:
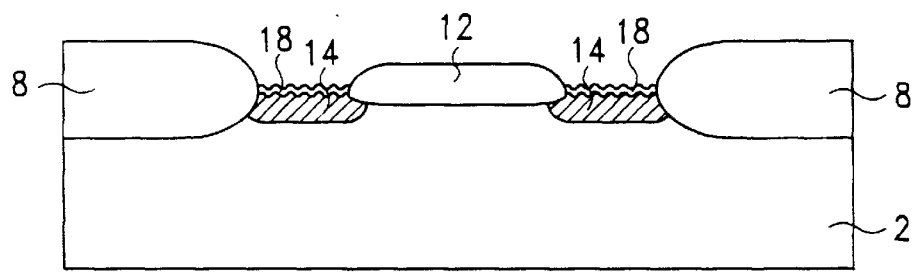
FIG. 7 is a cross-sectional view of a semiconductor wafer illustrating the step of performing a thermal oxidation to convert the ultra-thin α-Si into rugged tunnel oxide according to the present invention.

Referring to FIG. 6, an ultra-thin undoped amorphous silicon (α-Si) film 16 is deposited over the substrate 2. This α-Si film 16 is formed by LPCVD at a temperature of about 400–560° C. and has a thickness of about 20–300 angstroms. A thermal process with the temperature which could be raised gradually from 25° C. to 950° C. in an $N_2$ ambience follows, and the α-Si film 16 is recrystallized into polysilicon. Optionally, hemispherical grained silicon (HSG-Si) can be used instead of α-Si to form the silicon film 16 with a thickness of about 40–500 angstroms. Then, a thermal oxidation process is performed in a dry-oxygen ambience at a temperature of about 750–1050° C. At this step, there is an enhanced oxidation rate at the grain boundaries because of the rapid diffusion of oxygen through the grain boundaries of the thin polysilicon film into the Si substrate. Therefore, as mentioned by S. L. Wu, et al., in "Characterization of Thin Textured Tunnel Oxide Prepared by Thermal Oxidation of Thin Polysilicon Film on Silicon" (IEEE Trans. Electron Devices, Vol. 43, p. 287 (1996)), a rugged $Si/SiO_2$ interface is obtained. With the rugged silicon dioxide surface having protrusions and recesses thereon and shown in FIG. 7, the rugged interface will result in localized high electric field and subsequently enhance the electron injection from the substrate 2 into oxide. Thus, the rugged tunnel oxide exhibits a higher electron-injection efficiency, a significantly lower charge trapping rate, and a larger charge-to-breakdown in comparison with the conventional tunnel oxide.

Figure 8:
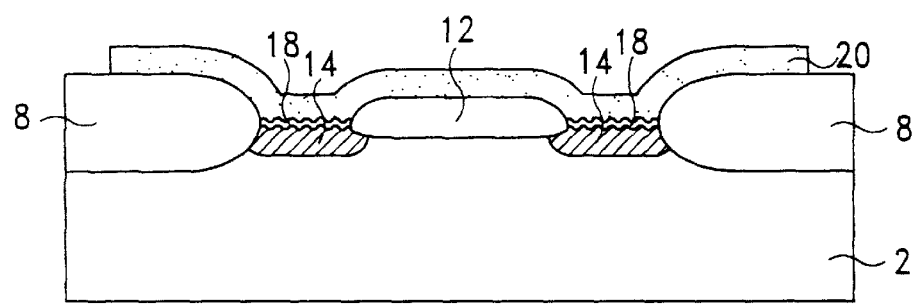
FIG. 8 is a cross-sectional view of a semiconductor wafer illustrating the step of depositing an n+ poly-Si film and then defining the floating gate according to the present invention.

Next, referring to FIG. 8, the conductive layer 20 is deposited on the substrate 2 preferably with a material of doped or in-situ doped n+ polysilicon by using a conventional LPCVD. A standard photolithography process is used to define the floating gate pattern. An anisotropic etching with Cl$_2$, HBr, SF$_6$ or SiCl$_4$ as the plasma source is then carried out to etch the conductive layer, thereby the floating gate 20 is formed on the active region and a portion of the field oxide region.

Figure 9:
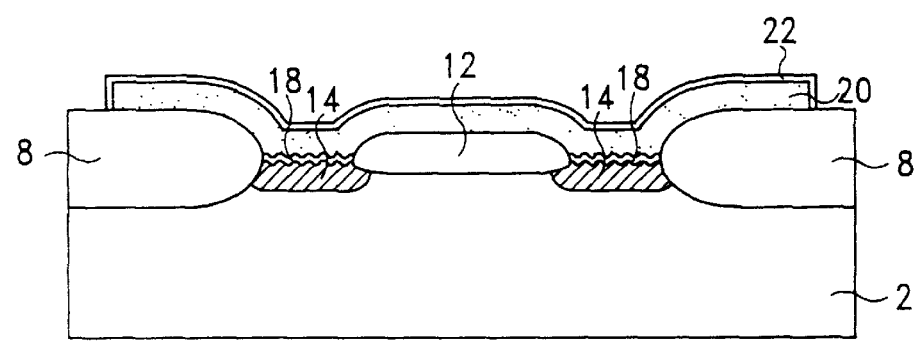
FIG. 9 is a cross-sectional view of a semiconductor wafer illustrating the step of forming an ultra-thin interpoly dielectric on the floating gate according to the present invention.

The ultra-thin interpoly dielectric (IPD) layer 22 deposited on the surface of the floating gate 20 is shown in FIG. 9. This interpoly dielectric layer 22 can be a material of a double film of silicon nitride and silicon oxide, a triple film of silicon oxide, silicon nitride and silicon oxide (ONO), or any other high dielectric constant film such as tantalum pentoxide (Ta$_2$O$_5$) or barium strontium titanate (BST). Finally, referring to FIG. 10, another conductive layer formed of doped or in-situ doped n+ polysilicon is deposited and patterning on the interpoly dielectric layer 22 to serve as the control gate 24.

Figure 10:
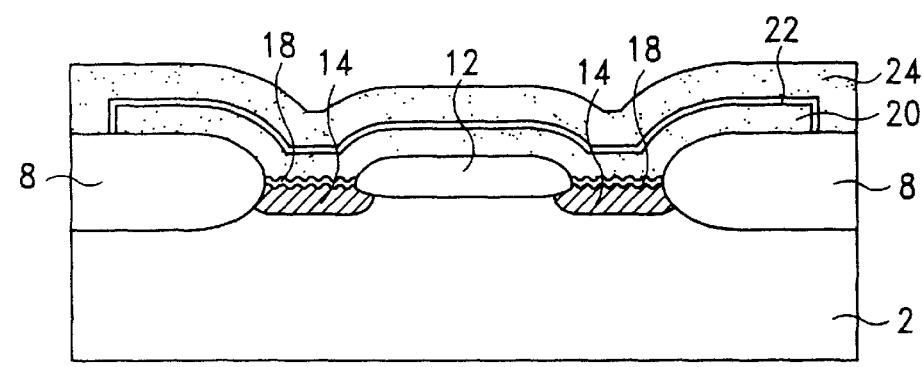
FIG. 10 is a cross-sectional view of a semiconductor wafer illustrating the step of depositing another n+ poly-Si film and then defining the control gate according to the present invention.

According to the method proposed above, the nonvolatile memory cell with rugged tunnel oxide of the present invention is thus finished on the semiconductor substrate 2. As shown in FIG. 10, there is a non-tunnel oxide 12 formed on the semiconductor substrate 2 with a bottom surface having recessed topography but. Beside the non-tunnel oxide 12, the tunnel oxides 18 are formed on the semiconductor substrate and are separated by the non-tunnel oxide 12 from each other. The doped ion regions 14 that serve as the source and drain are formed aligned to the tunnel oxides 18 in the semiconductor substrate 2. The stacked gate structure, which consists in turn of a floating gate 20, an interpoly dielectric 22 and a control gate 24, is formed over the tunnel and non-tunnel oxides 12 and 18. The most important feature of the present invention is that the tunnel oxides 18 are rugged at both the top surface and the bottom surface. As aforementioned, these rugged tunnel oxides 18 will result in localized high electric field and subsequently exhibit a high electron-injection efficiency, a significantly low charge trapping rate, and a large charge-to-breakdown. Utilizing the rugged tunnel oxide structure, the same tunnel injection can be achieved with a smaller tunnel area in comparison with the conventional tunnel oxide, and thus the high-density and high-speed nonvolatile memories can be obtained.

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structures.

What is claimed is:

1. A nonvolatile memory formed on a semiconductor substrate, said memory comprising:

a non-tunnel oxide formed on said semiconductor substrate, wherein said non-tunnel oxide has a thickness of about 500–2500 angstroms and a bottom surface with recessed topography;

channel region beneath said non-tunnel oxide tunnel oxides with rugged surfaces formed on said semiconductor substrate and separated by said non-tunnel oxide from each other;

doped ion regions formed aligned to said tunnel oxides in said semiconductor substrate a floating gate formed over said tunnel and non-tunnel oxides;

an interpoly dielectric formed on said floating gate; and a control gate formed on said dielectric layer.

2. The memory of claim 1, wherein said tunnel oxide has a thickness of about 50–500 angstroms.

3. The memory of claim 1, wherein said doped ions are n-type ions selected from the group consisting of phosphorus ions, arsenic ions and antimony ions.

4. The memory according to claim 1, wherein said dielectric layer is formed of the material selected from the group consisting of tantalum pentoxide (Ta$_2$O$_5$) barium strontium titanate (BST), a double film of silicon nitride and silicon oxide, and a triple film of silicon oxide, silicon nitride and silicon oxide (ONO).

5. A nonvolatile memory formed on a semiconductor substrate, said memory consisting essentially of:

a non-tunnel oxide formed on said semiconductor substrate, said non-tunnel oxide being formed with a bottom surface having recessed topography;

tunnel oxides with rugged surfaces formed on said semiconductor substrate and separated by said non-tunnel oxide from each other;

doped ion regions formed aligned to said tunnel oxides in said semiconductor substrate a floating gate formed over said tunnel and non-tunnel oxides;

an interpoly dielectric formed on said floating gate; and a control gate formed on said dielectric layer.

6. The memory of claim 5, wherein said non-tunnel oxide has a thickness of about 300–2500 angstroms.

7. The memory of claim 5, wherein said tunnel oxide has a thickness of about 50–500 angstroms.

8. The memory of claim 5, wherein said doped ions are n-type ions selected from the group consisting of phosphorus ions, arsenic ions and antimony ions.

9. The memory according to claim 5, wherein said dielectric layer is formed of the material selected from the group consisting of tantalum pentoxide (Ta$_2$O$_5$), barium strontium titanate (BST), a double film of silicon nitride and silicon oxide, and a triple film of silicon oxide, silicon nitride and silicon oxide (ONO).

10. A nonvolatile memory formed on a semiconductor substrate, said memory comprising:

a non-tunnel oxide formed on said semiconductor substrate, said non-tunnel oxide being formed with a upper surface without any considerable protrusive portion substantially perpendicular to said surface and with a bottom surface having recessed topography;

tunnel oxides with rugged surfaces formed on said semiconductor substrate and separated by said non-tunnel oxide from each other;

doped ion regions formed aligned to said tunnel oxides in said semiconductor substrate a floating gate formed over said tunnel and non-tunnel oxides;

an interpoly dielectric formed on said floating gate; and a control gate formed on said dielectric layer.

11. The memory of claim 10, wherein said non-tunnel oxide has a thickness of about 300–2500 angstroms.

12. The memory of claim 10, wherein said tunnel oxide has a thickness of about 50–500 angstroms.

13. The memory of claim 10, wherein said doped ions are n-type ions selected from the group consisting of phosphorus ions, arsenic ions and antimony ions.

14. The memory according to claim 10, wherein said dielectric layer is formed of the material selected from the group consisting of tantalum pentoxide (Ta$_2$O$_5$), barium strontium titanate (BST), a double film of silicon nitride and silicon oxide, and a triple film of silicon oxide, silicon nitride and silicon oxide (ONO).

* * * * *